(12) United States Patent
Herner

(10) Patent No.: US 7,830,697 B2
(45) Date of Patent: Nov. 9, 2010

(54) HIGH FORWARD CURRENT DIODES FOR REVERSE WRITE 3D CELL

(75) Inventor: S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 92 days.

(21) Appl. No.: 11/819,078

(22) Filed: Jun. 25, 2007

(65) Prior Publication Data

US 2008/0316809 A1 Dec. 25, 2008

(51) Int. Cl.
*G11C 11/00* (2006.01)
*G11C 11/14* (2006.01)

(52) U.S. Cl. .............. 365/148; 365/158; 365/163; 365/171; 365/173; 365/175; 365/225.7

(58) Field of Classification Search ......... 365/148, 365/158, 163, 171, 173, 230.06, 225.7; 257/3, 257/296; 438/131
See application file for complete search history.

(56) References Cited

U.S. PATENT DOCUMENTS

| 4,646,266 | A | 2/1987 | Ovshinsky et al. |
| 4,665,428 | A | 5/1987 | Hockley et al. |
| 5,432,729 | A | 7/1995 | Carson et al. |
| 5,559,732 | A | 9/1996 | Birge |
| 5,693,556 | A | 12/1997 | Cleeves |
| 5,745,407 | A | 4/1998 | Levy et al. |
| 5,751,012 | A | 5/1998 | Wolstenholme et al. |
| 5,835,396 | A | 11/1998 | Zhang |
| 5,915,167 | A | 6/1999 | Leedy |
| 5,962,911 | A | 10/1999 | Manley |
| 5,991,193 | A | 11/1999 | Gallagher et al. |
| 6,034,882 | A | 3/2000 | Johnson et al. |
| 6,111,784 | A | 8/2000 | Nishimura et al. |
| 6,236,587 | B1 | 5/2001 | Gudesen et al. |
| 6,306,718 | B1 | 10/2001 | Singh et al. |
| 6,420,215 | B1 | 7/2002 | Knall et al. |
| 6,483,736 | B2 | 11/2002 | Johnson et al. |
| 6,486,065 | B2 | 11/2002 | Vyvoda et al. |
| 6,525,953 | B1* | 2/2003 | Johnson ............ 365/225.7 |

(Continued)

FOREIGN PATENT DOCUMENTS

EP 1 450 373 8/2004

(Continued)

OTHER PUBLICATIONS

Yang et al., Patent Application Publication US 2007/0069241 A1 (U.S. Appl. No. 11/173,973).*

(Continued)

*Primary Examiner*—Trong Phan
(74) *Attorney, Agent, or Firm*—The Marbury Law Group, PLLC

(57) ABSTRACT

A nonvolatile memory device includes at least one memory cell which comprises a diode and a metal oxide antifuse dielectric layer, and a first electrode and a second electrode electrically contacting the at least one memory cell. In use, the diode acts as a read/write element of the memory cell by switching from a first resistivity state to a second resistivity state different from the first resistivity state in response to an applied bias.

20 Claims, 14 Drawing Sheets

U.S. PATENT DOCUMENTS

| | | | |
|---|---|---|---|
| 6,541,312 | B2 | 4/2003 | Vyvoda et al. |
| 6,567,301 | B2 | 5/2003 | Anthony et al. |
| 6,584,029 | B2 | 6/2003 | Tran et al. |
| 6,677,220 | B2 | 1/2004 | Van Brocklin et al. |
| 6,689,644 | B2 * | 2/2004 | Johnson ............... 438/131 |
| 6,693,823 | B2 | 2/2004 | Brown |
| 6,777,773 | B2 | 8/2004 | Knall |
| 6,834,008 | B2 * | 12/2004 | Rinerson et al. ............ 365/158 |
| 6,844,564 | B2 * | 1/2005 | Tanaka et al. ................. 257/3 |
| 6,879,508 | B2 * | 4/2005 | Tran ........................... 365/158 |
| 6,881,994 | B2 * | 4/2005 | Lee et al. ..................... 257/296 |
| 6,946,719 | B2 | 9/2005 | Petti et al. |
| 6,951,780 | B1 | 10/2005 | Herner |
| 6,952,030 | B2 | 10/2005 | Herner et al. |
| 6,952,043 | B2 | 10/2005 | Vyvoda et al. |
| 7,038,248 | B2 | 5/2006 | Lee |
| 7,176,064 | B2 | 2/2007 | Herner |
| 7,190,602 | B2 * | 3/2007 | Johnson et al. ........ 365/230.06 |
| 7,450,414 | B2 * | 11/2008 | Scheuerlein ............... 365/163 |
| 7,486,537 | B2 | 2/2009 | Scheuerlein et al. |
| 7,488,625 | B2 * | 2/2009 | Knall ........................ 438/131 |
| 7,542,338 | B2 | 6/2009 | Scheuerlein et al. |
| 2003/0001230 | A1 | 1/2003 | Lowrey |
| 2004/0016991 | A1 | 1/2004 | Herner et al. |
| 2004/0228159 | A1 | 11/2004 | Kostylev et al. |
| 2004/0232509 | A1 | 11/2004 | Vyvoda et al. |
| 2005/0052915 | A1 | 3/2005 | Herner et al. |
| 2005/0098800 | A1 | 5/2005 | Herner et al. |
| 2005/0121742 | A1 | 6/2005 | Petti et al. |
| 2005/0158950 | A1 | 7/2005 | Scheuerlein et al. |
| 2005/0226067 | A1 | 10/2005 | Herner et al. |
| 2006/0006495 | A1 | 1/2006 | Herner et al. |
| 2006/0250836 | A1 | 11/2006 | Herner et al. |
| 2006/0250837 | A1 | 11/2006 | Herner et al. |
| 2007/0002603 | A1 | 1/2007 | Cleeves |
| 2007/0069217 | A1 | 3/2007 | Herner et al. |
| 2007/0069276 | A1 | 3/2007 | Scheuerlein |
| 2007/0072360 | A1 | 3/2007 | Kumar et al. |
| 2007/0114509 | A1 | 5/2007 | Herner |

FOREIGN PATENT DOCUMENTS

| | | |
|---|---|---|
| WO | WO 2004/055827 | 7/2004 |

OTHER PUBLICATIONS

U.S. Appl. No. 10/095,962, filed Mar. 13, 2002, Herner et al.
U.S. Appl. No. 10/185,507, filed Jun. 27, 2002, Vyvoda et al.
U.S. Appl. No. 10/440,882, filed May 19, 2003, Vyvoda et al.
U.S. Appl. No. 10/728,436, filed Dec. 5, 2003, Chen.
U.S. Appl. No. 10/728,451, filed Dec. 5, 2003, Cleeves et al.
U.S. Appl. No. 10/815,312, filed Apr. 1, 2004, Chen.
U.S. Appl. No. 10/883,417, filed Jun. 30, 2004, Raghuram et al.
U.S. Appl. No. 10/954,510, filed Sep. 29, 2004, Herner.
U.S. Appl. No. 10/148,530, filed Jun. 8, 2006, Herner et al.
U.S. Appl. No. 11/395,995, filed Mar. 31, 2006, Herner et al.
U.S. Appl. No. 11/444,936, filed May 31, 2006, Radigan et al.
U.S. Appl. No. 11/693,858, filed Mar. 30, 2007, Kumar et al.
U.S. Appl. No. 11/819,079, filed Jun. 25, 2007, Herner.
Alavi et al, "A PROM Element Based on Salicide Agglomeration of Poly Fuses in a CMOS Logic Process", IEDM 1997.
Amemiya et al., "Electrical Trimming of Heavily Doped Polycrystalline Silicon Resistors", IEEE Transactions Electron Devices, vol. ED-26, No. 11, Nov. 1979.
Babcock, J. A. et al., "Polysilicon Resistor Trimming for Packaged Integrated Circuits", IEDM 93, 1993, pp. 247-250.
Babcock, J. A. et al., "Precision Electrical Trimming of Very Low TCR Poly-Sige Resistors," IEEE Service Center, vol. 21, No. 6, Jun. 2000, pp. 283-285, abstract Figs. 2, 4.
Das, Soumen et al., "Electrical Trimming of Ion-Beam-Sputtered Polysilicon Resistors by High Current Pulses", IEEE Transaction of Electron Devices, vol. 41, No. 8, pp. 1429-1434, Aug. 1994.
Feldbaumer, D. W. et al., "Theory and Application of Polysilicon Resistor Trimming", Solid-State Electronics, vol. 38, No. 11, 1995, pp. 1861-1869.
Feldbaumer, D.W., "Pulse Current Trimming of Polysilicon Resistors", IEEE Transactions on Electron Devices, vol. 42, No. 4, pp. 689-696, Apr. 1995.
Kato, Kotaro et al., "A Monolithic 14 Bit D/A Converter Fabricated with a New Trimming Technique (DOT)", IEEE Journal of Solid-State Circuits, vol. SC-19, No. 5, pp. 802-804-806, Oct. 1984.
Kato, Kotaro et al., "A Physical Mechanism of Current-Induced Resistance Decrease in Heavily Doped Polysilicon Resistors", IEEE Transaction on Electron Devices, vol. ED-29, No. 8, pp. 1156-1160, Aug. 1982.
Kato, Kotaro et al., "Change in Temperature Coefficient of Resistance of Heavily Doped Polysilicon Resistors Caused by Electrical Trimming", Jpn. J. Appl. Phys., vol. 35, Part 1, No. 8, pp. 14209-14215, Aug. 1996.
Lane, William A., "The Design of Thin-Film Polysilicon Resistors for Analog IC Applications", IEEE Transactions on Electron Devices, vol. 36, No. 4, pp. 738-744, Apr. 1989.
Tobita, Toshio, "New Trimming Technology of a Thick Film Resistor by the Pulse Voltage Method", IEEE Transactions on Components, Hybrids and Manufacturing Technology, vol. 14, No. 3, pp. 613-617, Sep. 1991.
International Search Report dated Oct. 6, 2008 received in corresponding International Application No. PCT/US2008/007802 (4 pgs.).
Office Action, mailed Aug. 13, 2009, received in co-pending U.S. Appl. No. 11/819,079.
Notice of Allwability received in U.S. Appl. No. 11/819,079.

* cited by examiner

US 7,830,697 B2

HIGH FORWARD CURRENT DIODES FOR REVERSE WRITE 3D CELL

BACKGROUND OF THE INVENTION

This application is related to Herner, U.S. application Ser. No. 11/819,079, titled "METHOD OF MAKING HIGH FORWARD CURRENT DIODES FOR REVERSE WRITE 3D CELL" filed on the same day herewith, and hereby incorporated by reference in its entirety.

The invention relates to a nonvolatile memory array.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

A substantial advantage would be provided by a nonvolatile memory array having erasable or multi-state memory cells formed using conventional semiconductor materials in structures that are readily scaled to small size.

SUMMARY OF THE PREFERRED EMBODIMENTS

The present invention is defined by the following claims, and nothing in this section should be taken as a limitation on those claims.

One embodiment provides a nonvolatile memory device, comprising at least one memory cell which comprises a diode and a metal oxide antifuse dielectric layer, and a first electrode and a second electrode electrically contacting the at least one memory cell. In use, the diode acts as a read/write element of the memory cell by switching from a first resistivity state to a second resistivity state different from the first resistivity state in response to an applied bias.

Another embodiment provides a nonvolatile memory device, comprising a plurality of memory cells, and a first electrode and a second electrode electrically contacting the plurality of memory cells. Each memory cell of the plurality of memory cells comprises a diode and a metal oxide antifuse dielectric layer arranged in series between the first and the second electrodes, and the diode comprises a polycrystalline silicon, germanium or silicon-germanium p-i-n pillar diode having a substantially cylindrical shape.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
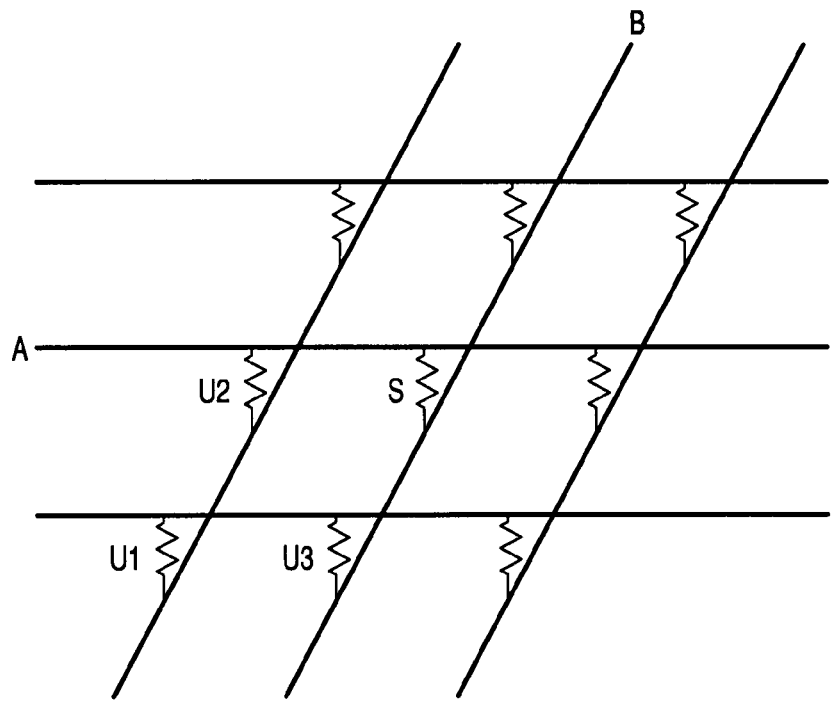
FIG. 1 is a circuit diagram illustrating the need for electrical isolation between memory cells in a memory array.

It is not conventional to use a trimmable polysilicon resistor to store a data state in a nonvolatile memory cell, however. Making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory cell as a two-terminal device including a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, describes a monolithic three dimensional memory array in which the data state of a memory cell is stored in the resistivity state of the polycrystalline semiconductor material of a semiconductor junction diode. This memory cell is a one-time-programmable cell having two data states. The diode is formed in a high-resistivity state; application of a programming voltage permanently transforms the diode to a low-resistivity state.

In embodiments of the present invention, by applying appropriate electrical pulses, a memory element formed of doped semiconductor material, for example the semiconductor diode of the '549 application, can achieve three, four, or more stable resistivity states. In other embodiments of the present invention, semiconductor material can be converted from an initial high-resistivity state to a lower-resistivity state; then, upon application of an appropriate electrical pulse, can be returned to a higher-resistivity state. These embodiments can be employed independently or combined to form a memory cell which can have two or more data states, and can be one-time-programmable or rewriteable.

As noted, including a diode between conductors in the memory cell allows its formation in a highly dense cross-point memory array. In preferred embodiments of the present invention, then, a polycrystalline, amorphous, or microcrystalline semiconductor memory element either is formed in series with a diode or, more preferably, is formed as the diode itself.

In this discussion, transition from a higher- to a lower-resistivity state will be called a set transition, affected by a set current, a set voltage, or a set pulse; while the reverse transition, from a lower- to a higher-resistivity state, will be called a reset transition, affected by a reset current, a reset voltage, or a reset pulse.

In preferred one-time-programmable embodiments, a polycrystalline semiconductor diode is paired with a dielectric rupture antifuse, such as a high dielectric constant material antifuse layer, as will be described in more detail below.

Figure 2:
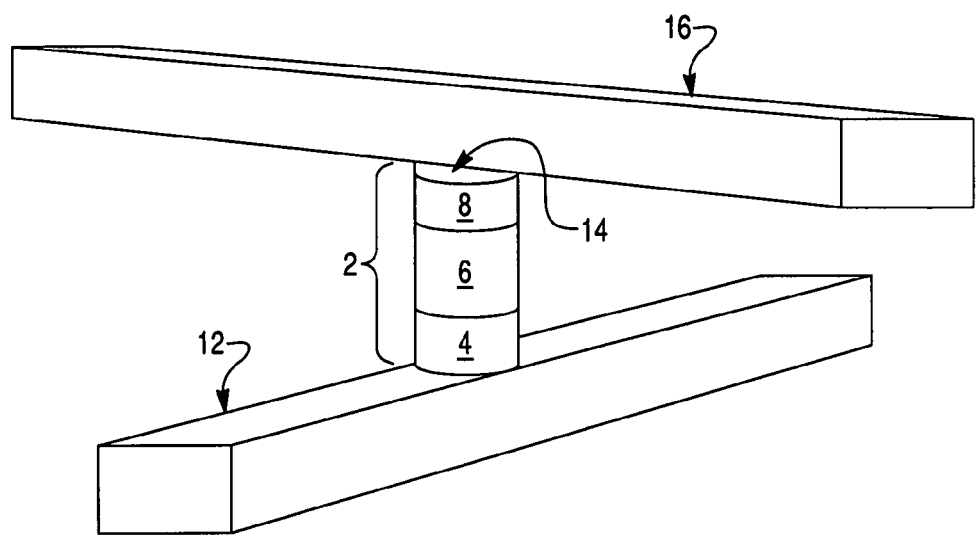
FIGS. 2 and 16a are perspective views and FIG. 16b is a side cross sectional view of multi-state or rewriteable memory cells formed according to a embodiments of the present invention.
Figure 3:
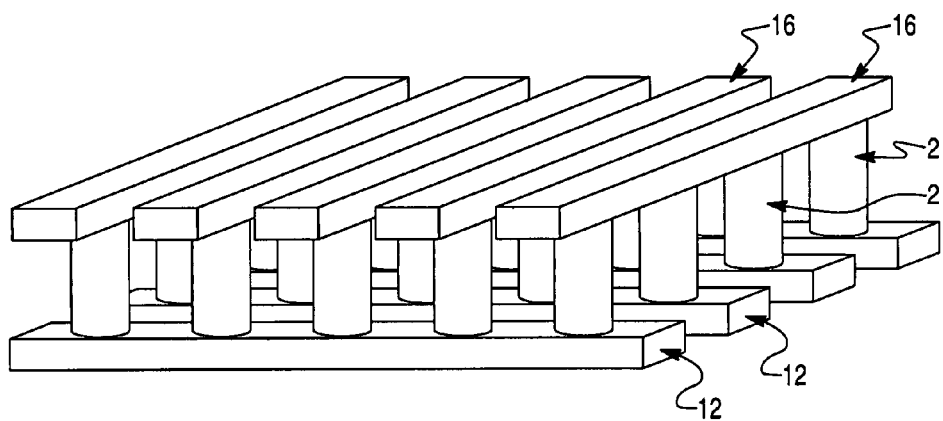
FIG. 3 is a perspective view of a portion of a memory level comprising the memory cells of FIG. 2.

FIG. 2 illustrates a memory cell formed according to a preferred embodiment of the present invention. A bottom conductor 12 is formed of a conductive material, for example tungsten, and extends in a first direction. Barrier and adhesion layers may be included in bottom conductor 12. Polycrystalline semiconductor diode 2 has a bottom heavily doped n-type region 4; an intrinsic region 6, which is not intentionally doped; and a top heavily doped region 8, though the orientation of this diode may be reversed. Such a diode, regardless of its orientation, will be referred to as a p-i-n diode. Dielectric rupture antifuse 14 is provided in series with the diode 2. Top conductor 16 may be formed in the same manner and of the same materials as bottom conductor 12, and extends in a second direction different from the first direction. Polycrystalline semiconductor diode 2 is vertically disposed between bottom conductor 12 and top conductor 16. Polycrystalline semiconductor diode 2 is formed in a high-resistivity state. This memory cell can be formed above a suitable substrate, for example above a monocrystalline silicon wafer. FIG. 3 shows a portion of a memory level of such devices formed in a cross-point array, where diodes 2 are disposed between bottom conductors 12 and top conductors 16 (antifuses 14 are omitted in this view.) Multiple memory levels can be stacked over a substrate to form a highly dense monolithic three dimensional memory array.

In this discussion a region of semiconductor material which is not intentionally doped is described as an intrinsic region. It will be understood by those skilled in the art, however, that an intrinsic region may in fact include a low concentration of p-type or n-type dopants. Dopants may diffuse into the intrinsic region from adjacent regions, or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral.

The resistivity of doped polycrystalline or microcrystalline semiconductor material, for example silicon, can be changed between stable states by applying appropriate electrical pulses. It has been found that in preferred embodiments, set transitions are advantageously performed with the diode under forward bias, while reset transitions are most readily achieved and controlled with the diode under reverse bias. In some instances, however, set transitions may be achieved with the diode under reverse bias, while reset transitions are achieved with the diode under forward bias.

Semiconductor switching behavior is complex. For a diode, both set and reset transitions have been achieved with the diode under forward bias. Generally a reset pulse applied with the diode under forward bias which is sufficient to switch the polycrystalline semiconductor material making up a diode from a given resistivity state to a higher resistivity state will be lower amplitude than a corresponding set pulse (which will switch the same polysilicon semiconductor material from the same resistivity state to a lower resistivity state) and will have a longer pulse width.

Figure 4:
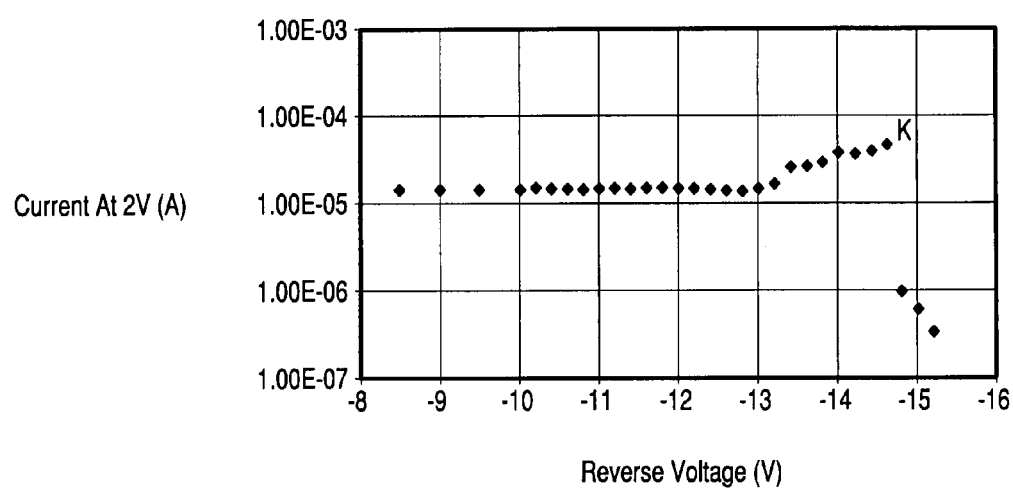
FIG. 4 is a graph showing change in read current for a memory cell of the present invention as voltage in reverse bias across the diode increases.

Switching under reverse bias shows a distinct behavior. Suppose a polysilicon p-i-n diode like the one shown in FIG. 2 is subjected to a relatively large switching pulse under reverse bias. After application of the switching pulse a smaller read pulse, for example 2 volts, is applied, and the current flowing through the diode at the read voltage, called the read current, is measured. As the voltage of the switching pulse under reverse bias is increased in subsequent pulses, the subsequent read current at two volts changes as shown in FIG. 4. FIG. 4 shows current at 2V (A) versus reverse voltage (V). It will be seen that initially as the reverse voltage and current of the switching pulse are increased, the read current, when a read voltage is applied after each switching pulse, increases; i.e. the initial transition of the semiconductor material (silicon, in this case) is in the set direction toward lower resistivity. Once the switching pulse reaches a certain reverse bias voltage, at point K in FIG. 4, about −14.6 volts in this example, the read current abruptly begins to drop as reset is achieved and resistivity of the silicon increases. The switching voltage at which the set trend is reversed and the silicon of the diode begins to reset varies, depending on, for example, the resistivity state of the silicon making up the diode when application of the reverse bias switching pulse is begun. It will be seen, then, that by selecting appropriate voltages, either set or reset of the semiconductor material making up the diode can be achieved with the diode under reverse bias.

Distinct data states of the memory cell of the present invention correspond to resistivity states of polycrystalline or microcrystalline semiconductor material making up the diode, which are distinguished by detecting current flow through the memory cell (between top conductor 16 and bottom conductor 12) when a read voltage is applied. Preferably the current flowing between any one distinct data state and any different distinct data state is at least a factor of two, to allow the difference between the states to be readily detectable.

The memory cell can be used as a one-time programmable cell or a rewriteable memory cell, and may have two, three, four, or more distinct data states. The cell can be converted from any of its data states to any other of its data states in any order, and under either forward or reverse bias. In use, the diode acts as a read/write element of the memory cell by switching from a first resistivity state to a second resistivity state different from the first resistivity state in response to an applied bias In one embodiment of the invention, the read current of the programmed diode can be increased by the use of high dielectric constant (k) antifuses. These antifuses are shown to result in a 50% increase in the programmed read current at a given read voltage, such as at a 2V read voltage, compared to the lower dielectric constant $SiO_2$ antifuses. This results in a larger difference between the programmed and reset state currents for a reverse write memory cell.

Preferably, the antifuse is composed of a metal oxide antifuse dielectric layer, such as a layer having a dielectric constant higher than 3.9, such as for example about 4.5 to about 8. Other dielectric layers having a dielectric constant above 3.9 may also be used. The metal oxide material may be a stoichiometric or non-stoichiometric material. For example, the metal oxide may be selected from one or a blend of more than one of the following materials: hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, or zirconium silicon aluminum oxynitride. These materials may have the following chemical formulas: $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, $HfSiON$, $ZrSiAlO_x$, $HfSiAlO_x$, HfSiAlON, and ZrSiAlON, and may be combined with $SiO_2$ and/or $SiN_x$. Hafnium oxide or aluminum oxide are preferred.

Preferably, the metal oxide antifuse dielectric layer is located adjacent to a p-type region of the diode. The antifuse dielectric layer preferably has a thickness of about 10 to about 100 Angstroms, such as about 30 to about 40 Angstroms.

Several examples of preferred embodiments will be provided. It will be understood, however, that these examples are not intended to be limiting. It will be apparent to those skilled in the art that other methods of programming a two-terminal device comprising a diode and polycrystalline or microcrystalline semiconductor material will fall within the scope of the invention.

One-Time Programmable Multilevel Cell

In a preferred embodiment of the present invention, a diode formed of polycrystalline semiconductor material and a dielectric rupture antifuse are arranged in series disposed between a top and bottom conductor. The two-terminal device is used as a one-time-programmable multilevel cell, in preferred embodiments having three or four distinct data states.

A preferred memory cell is shown in FIG. 2. Diode 2 is preferably formed of a polycrystalline or microcrystalline semiconductor material, for example silicon, germanium, or an alloy of silicon and/or germanium. Diode 2 is most preferably polysilicon. In this example, bottom heavily doped region 4 is n-type and top heavily doped region 8 is p-type, though the polarity of the diode may be reversed. The memory cell comprises a portion of the top conductor, a portion of the bottom conductor, and a diode, the diode disposed between the conductors.

Figure 5:
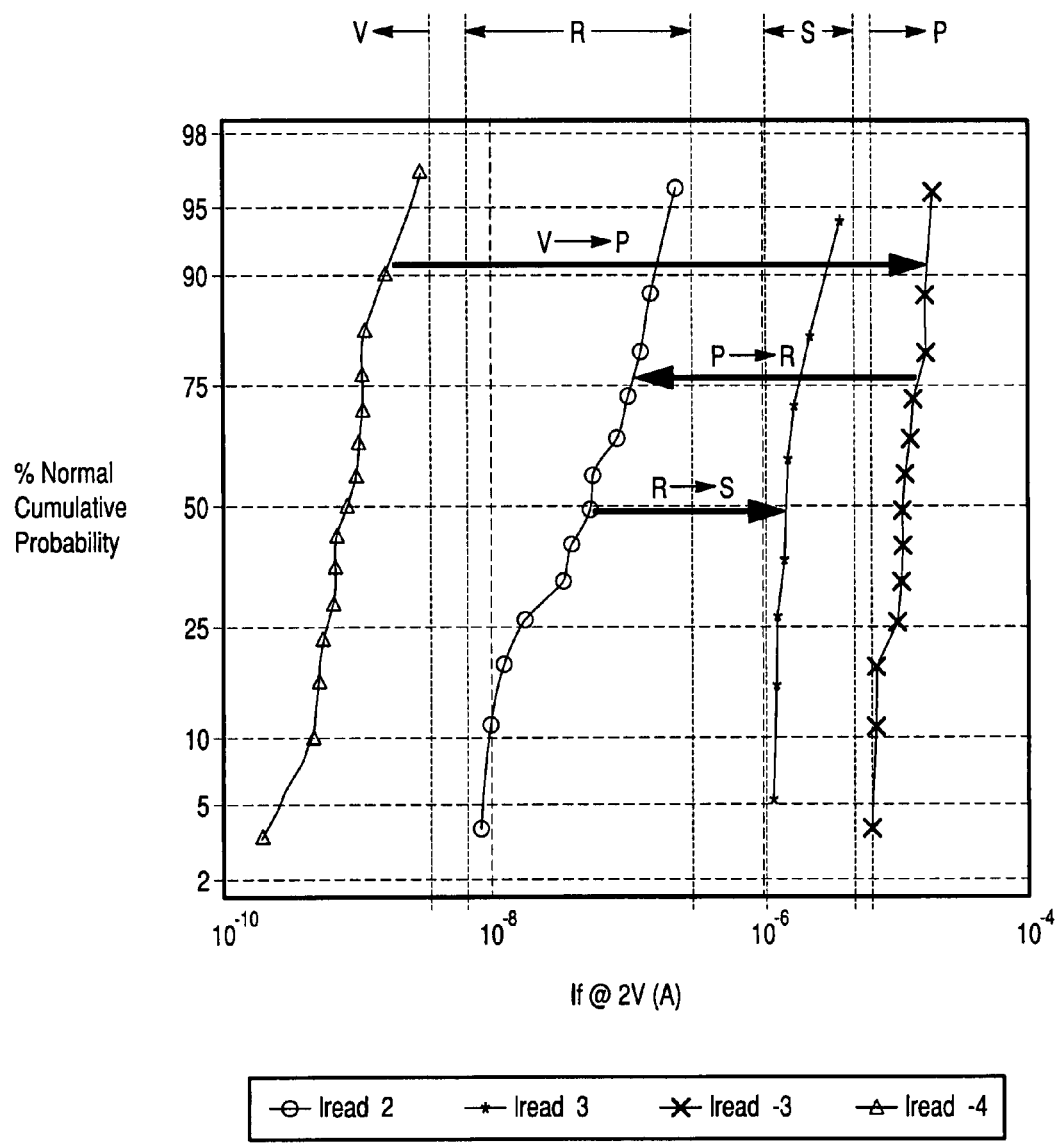
FIG. 5 is a probability plot showing memory cells transformed from the V state to the P state, from the P state to the R state, and from the R state to the S state.

As formed, the polysilicon of diode 2 is in a high-resistivity state, and dielectric rupture antifuse 14 is intact. FIG. 5 is a probability plot showing current of a plurality of memory cells containing silicon dioxide antifuse dielectric layers in various states. FIG. 5 shows percent (%) Normal Cumulative Probability versus read current at 2 volts (If @ 2V (A)) for read current values Iread 2, 3, −3 and −4 corresponding to states R, S, P and V. Turning to FIG. 5, when a read voltage, for example 2 volts, is applied between top conductor 16 and bottom conductor 12 (with diode 2 under forward bias) the read current flowing between top conductor 16 and bottom conductor 12 is preferably in the range of nanoamps, for example less than about 5 nanoamps. Area V on the graph of FIG. 5 corresponds to a first data state of the memory cell. For some memory cells in the array, this cell will not be subjected to set or reset pulses, and this state will be read as a data state of the memory cell. This first data state will be referred to as the V state.

A first electrical pulse, preferably with diode 2 under forward bias, is applied between top conductor 16 and bottom conductor 12. This pulse is, for example, between about 8 volts and about 12 volts, for example about 10 volts. The current is, for example, between about 80 and about 200 microamps. The pulse width is preferably between about 100 and about 500 nsec. This first electrical pulse ruptures dielectric rupture antifuse 14 and switches the semiconductor material of diode 2 from a first resistivity state to a second resistivity state, the second state lower resistivity than the first. This second data state will be referred to as the P state, and this transition is labeled "V→P" in FIG. 5. The current flowing between top conductor 16 and bottom conductor 12 at a read voltage of 2 volts is about 10 microamps or more. The resistivity of the semiconductor material making up diode 2 is reduced by a factor of about 1000 to about 2000. In other embodiments the change in resistivity will be less, but between any data state and any other data state will be at least a factor of two, preferably at least a factor of three or five, and more typically a factor of 100 or more. Some memory cells in the array will be read at this data state, and will not be subjected to additional set or reset pulses. This second data state will be referred to as the P state.

For example, the read current at 2V can increase from $1 \times 10^{-8}$ A in the unprogrammed state to at least $1 \times 10^{-5}$ A after the programming pulse. The table below shows that increasing the programming voltage results in a higher read current. The last column in the table shows the standard deviation of the read current.

| Programming Pulse Voltage | Programmed Read Current @ +2 V | 1σ |
| --- | --- | --- |
| +6.4 V | $1.1 \times 10^{-5}$ A | $6.1 \times 10^{-6}$ A |
| +7.4 V | $1.7 \times 10^{-5}$ A | $7.2 \times 10^{-6}$ A |
| +8.4 V | $1.8 \times 10^{-5}$ A | $5.4 \times 10^{-6}$ A |

It should be noted that the read currents shown in the table above are for a cell shown in FIG. 2 with the interconnects and a silicon oxide antifuse. If the interconnects are excluded and a metal oxide antifuse is used, then the read current is even higher. For example, for a programming voltage of 8.4V, the read current of the cell without the interconnects is at least $3.5 \times 10^{-5}$ A at a read voltage of at least +1.5V, such as +1.5 to +2V. It is expected that further increases in programming voltage would provide a further increase in the read current. For example, increasing the programming voltage from 8.4V to 10V is expected to generate an about 70% increase in read current, such that the read current for a cell without the interconnects is about $6 \times 10^{-5}$ A at 2V read voltage. As noted above, multiple programming pulses, such as 2 to 10 pulses, for example 3-5 pulses, may be applied to the diode. Furthermore, the use of a metal oxide antifuse dielectric layer further increases the read current, as will be discussed below with respect to FIGS. 17a-17c.

A second electrical pulse, preferably with diode 2 under reverse bias, is applied between top conductor 16 and bottom conductor 12. This pulse is, for example, between about −8 volts and about −14 volts, preferably about between about −10 and about −12 volts, preferably about −11 volts. The current is, for example, between about 80 and about 200 microamps. The pulse width is, for example, between about 100 nanosec and about 10 microseconds; preferably between about 100 nsec and about 1 microsecond, most preferably between about 200 and about 800 nsec. This second electrical pulse switches the semiconductor material of diode 2 from the second resistivity state to a third resistivity state, the third resistivity state higher resistivity than the second. The current flowing between top conductor 16 and bottom conductor 12 at a read voltage of 2 volts is between about 10 and about 500 nanoamps, preferably between about 100 and about 500 nanoamps. Some memory cells in the array will be read at this data state, and will not be subjected to additional set or reset pulses. This third data state will be referred to as the R state, and this transition is labeled "P→R" in FIG. 5.

Figure 10:
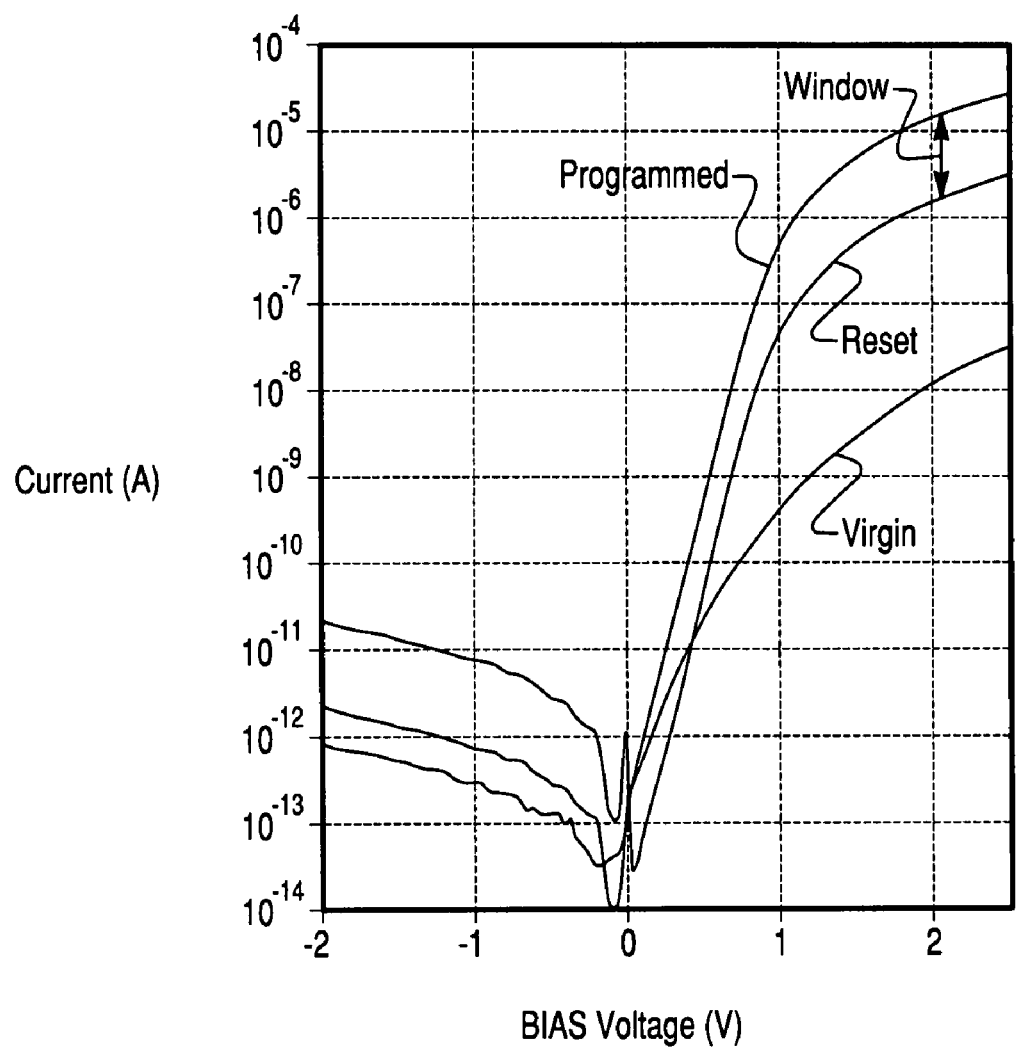
FIG. 10 is a plot of the current flowing through the diode versus the applied voltage for various diode states illustrated in FIG. 5.

FIG. 10 is a plot of read current versus read voltage for various diode states illustrated in FIG. 5. The diode initially starts in a low read current state V (referred to as the unprogrammed or "virgin" state). The diode is put the in the programmed state P by the high forward bias pulse, preferably at the factory where the diode is made before the product is sold, where power is not a consideration. Once the product is sold, the diode is subsequently put in the reset state R by a reverse bias programming pulse. The difference between the read currents of the programmed and reset states P and R constitutes the "window" for the memory cell, as shown in FIG. 10. The large programming voltage and/or multiple programming pulses allow this window to be as large as possible for manufacturing robustness.

To achieve the fourth data state, a third electrical pulse, preferably with diode 2 under forward bias, is applied between top conductor 16 and bottom conductor 12. This pulse is, for example, between about 8 volts and about 12 volts, for example about 10 volts, with current between about 5 and about 20 microamps. This third electrical pulse switches the semiconductor material of diode 2 from the third resistivity state to a fourth resistivity state, the fourth resistivity state lower resistivity than the third, and preferably higher resistivity than the second resistivity state. The current flowing between top conductor 16 and bottom conductor 12 at a read voltage of 2 volts is between about 1.5 and about 4.5 microamps. Some memory cells in the array will be read at this data state, which will be referred to as the S state, and this transition is labeled "R→S" in FIG. 5.

The difference in current at the read voltage (for example 2 volts) is preferably at least a factor of two between any two adjacent data states. For example, the read current of any cell in data state R is preferably at least two times that of any cell in data state V, the read current of any cell in data state S is preferably at least two times that of any cell in data state R, and the read current of a cell in data state P is preferably at least two times that of any cell in data state S. For example, the read current at data state R may be two times the read current at data state V, the read current at data state S may be two times the read current at data state R, and the read current at data state P may be two times the read current at data state S. If the ranges are defined to be smaller, the difference could be considerably larger; for example, if the highest-current V state cell can have a read current of 5 nanoamps and the lowest-current R state call can have a read current of 100 nanoamps, the difference in current is at least a factor of 20. By selecting other limits, it can be assured that the difference in read current between adjacent memory states will be at least a factor of three.

As will be described later, an iterative read-verify-write process may be applied to assure that a memory cell is in one of the defined data states after a set or reset pulse, and not between them.

So far the difference between the highest current in one data state and the lowest current in the next highest adjacent data state has been discussed. The difference in read current in most cells in adjacent data states will be larger still; for example a memory cell in the V state may have a read current of 1 nanoamp, a cell in the R state may have a read current of 100 nanoamps, a cell in the S state may have a read current of 2 microamps (2000 nanoamps), and a cell in the P state may have a read current of 20 microamps. These currents in each adjacent state differ by a factor of ten or more.

A memory cell having four distinct data states has been described. To aid in distinguishing between the data states, it may be preferred for three rather than four data states to be selected. For example, a three-state memory cell can be formed in data state V, set to data state P, then reset to data state R. This cell will have no fourth data state S. In this case the difference between adjacent data states, for example between the R and P data states, can be significantly larger.

A one-time programmable memory array of memory cells as described, each cell programmed to one of three distinct data states (in one embodiment) or one of four distinct data states (in an alternative embodiment), can be programmed as described. These are only examples; clearly there could be more than three or four distinct resistivity states and corresponding data states.

Figure 6:
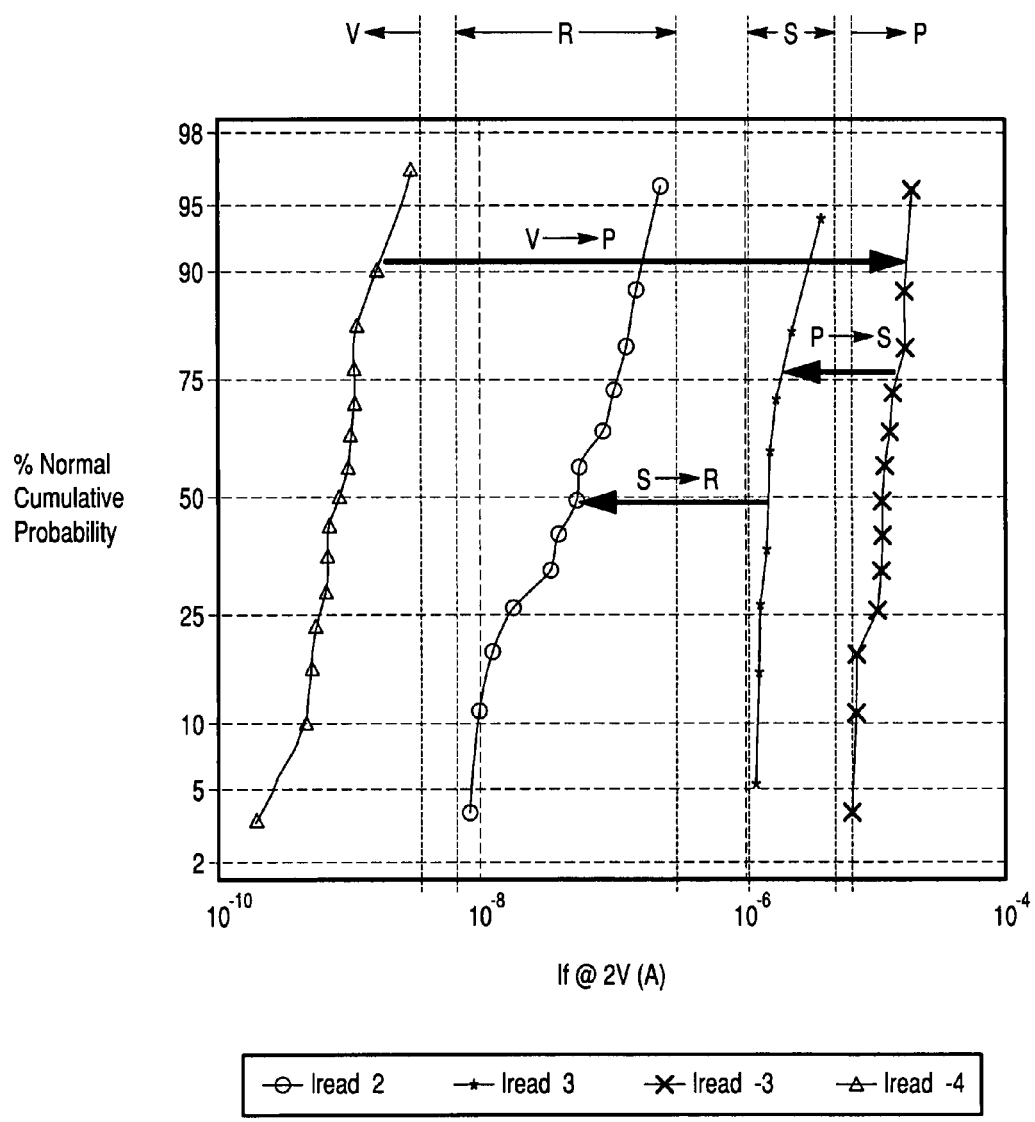
FIG. 6 is a probability plot showing memory cells transformed from the V state to the P state, from the P state to the S state, and from the S state to the R state.

In a memory array of one-time programmable memory cells, the cells may be programmed in a variety of ways, however. For example, turning to FIG. 6, the memory cell of FIG. 2 may be formed in a first state, the V state. FIG. 6 shows percent (%) Normal Cumulative Probability versus read current at 2 volts (If @ 2V (A)) for read current values Iread 2, 3, −3 and −4 corresponding to states R, S, P and V. A first electrical pulse, preferably under forward bias, ruptures antifuse 14 and switches the polysilicon of the diode from a first resistivity state to a second resistivity state lower than the first, placing the memory cell in the P state, which in this example is the lowest resistivity state (labeled V→P). A second electrical pulse, preferably under reverse bias, switches the polysilicon of the diode from the second resistivity state to a third resistivity state, the third resistivity state higher resistivity than the second, placing the memory cell in the S state (labeled P→S). A third electrical pulse, preferably also under reverse bias, switches the polysilicon of the diode from the third resistivity state to a fourth resistivity state, the third resistivity state higher resistivity than the second, placing the memory cell in the R state (labeled S→R). For any given memory cell, any of the data states, the V state, the R state, the S state, and the P state, can be read as a data state of the memory cell. Each transition is labeled in FIG. 6. Four distinct states are shown; there could be three or more than four states as desired.

Figure 7:
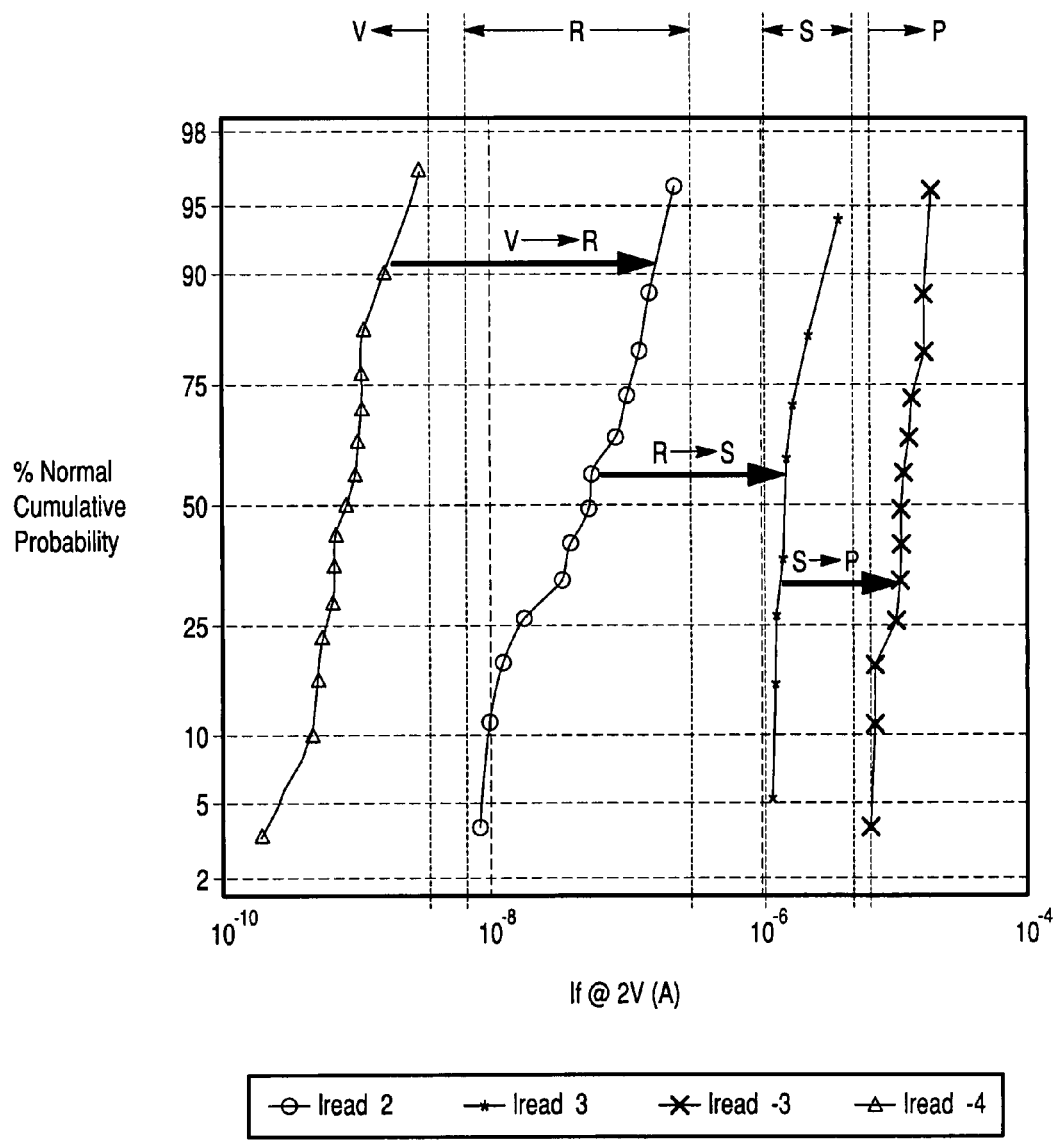
FIG. 7 is a probability plot showing memory cells transformed from the V state to the R state, from the R state to the S state, and from the S state to the P state.

In still other embodiments, each successive electrical pulse can switch the semiconductor material of the diode to a successively lower resistivity state. As in FIG. 7, for example, the memory cell can proceed from the initial V state to the R state (labeled V→R), from the R state to the S state (labeled R→S), and from the S state to the P state (labeled S→P), where for each state the read current is at least two times the read current at the previous state, each corresponding to a distinct data state. FIG. 7 shows percent (%) Normal Cumulative Probability versus read current at 2 volts (If @ 2V (A)) for read current values Iread 2, 3, −3 and −4 corresponding to states R, S, P and V. In this example the pulses may be applied under either forward or reverse bias. In alternative embodiments there may be three data states or more than four data states.

Figure 8:
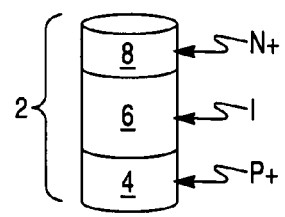
FIG. 8 is a perspective view of a vertically oriented p-i-n diode that may be used in embodiments of the present invention.

In one embodiment, a memory cell includes the polysilicon or microcrystalline diode 2 shown in FIG. 8, including bottom heavily doped p-type region 4 (P+), middle intrinsic or lightly doped region 6 (I), and top heavily doped n-type region 8 (N+). As in prior embodiments, this diode 2 can be arranged in series with a dielectric rupture antifuse, the two disposed between top and bottom conductors. Bottom heavily doped p-type region 4 may be in situ doped, i.e. doped by flowing a gas that provides a p-type dopant such as boron during deposition of the polysilicon, such that dopant atoms are incorporated into the film as it forms.

Figure 9:
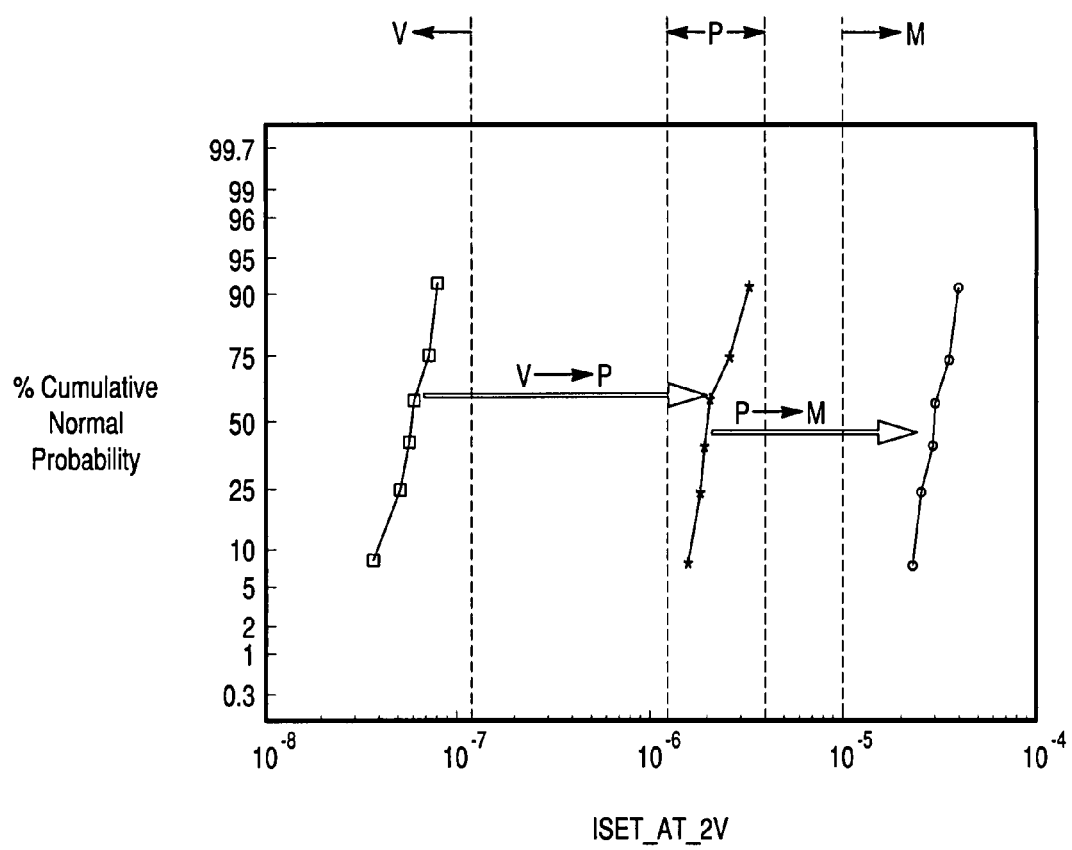
FIG. 9 is a probability plot showing memory cells transformed from the V state to the P state, and from the P state to the M state.

Turning to FIG. 9, it has been found that this memory cell is formed in the V state, where the current between top conductor 16 and bottom conductor 12 is less than about 80 nanoamps at a read voltage of 2 volts. FIG. 9 shows percent (%) Normal Cumulative Probability versus current at 2 volts (ISET$_{13}$AT_2V) for current corresponding to states V, P and M. A first electrical pulse, preferably applied under forward bias of, for example, about 8 volts, ruptures dielectric rupture antifuse 14, and switches the polysilicon of diode 2 from a first resistivity state to a second resistivity state, the second resistivity state lower than the first, placing the memory cell in data state P (labeled V→P). In data state P, the current between top conductor 16 and bottom conductor 12 at the read voltage is between about 1 microamp and about 4 microamps. A second electrical pulse, preferably applied in reverse bias, switches the polysilicon of diode 2 from the second resistivity state to a third resistivity state, the third resistivity state lower than the first (labeled P→M). The third resistivity state corresponds to data state M. In data state M, the current between top conductor 16 and bottom conductor 12 at the read voltage is above about 10 microamps. As in prior embodiments, the difference in current between any cell in adjacent data states (the highest-current cell of state V and the lowest-current cell of state P, or between the highest-current cell of state P and the lowest-current cell of state M) is preferably at least a factor of two, preferably a factor of three or more. Any of the data states V, P, or M can be detected as a data state of the memory cell.

FIG. 4 showed that when a semiconductor diode is subjected to reverse bias, in general the semiconductor material initially undergoes a set transition to lower resistivity, then, as voltage is increased, undergoes a reset transition to higher resistivity. For this particular diode, with top heavily doped n-type region 8, and preferably with bottom heavily doped region 4 formed by in situ doping with a p-type dopant, the switch from set transition to reset transition with increasing reverse bias voltage does not occur as abruptly or as steeply as with other embodiments of the diode. This means a set transition under reverse bias is easier to control with such a diode.

Rewritable Memory Cell

In another set of embodiments, the memory cell behaves as a rewriteable memory cell, which is repeatably switchable between two or between three data states.

Figure 11:
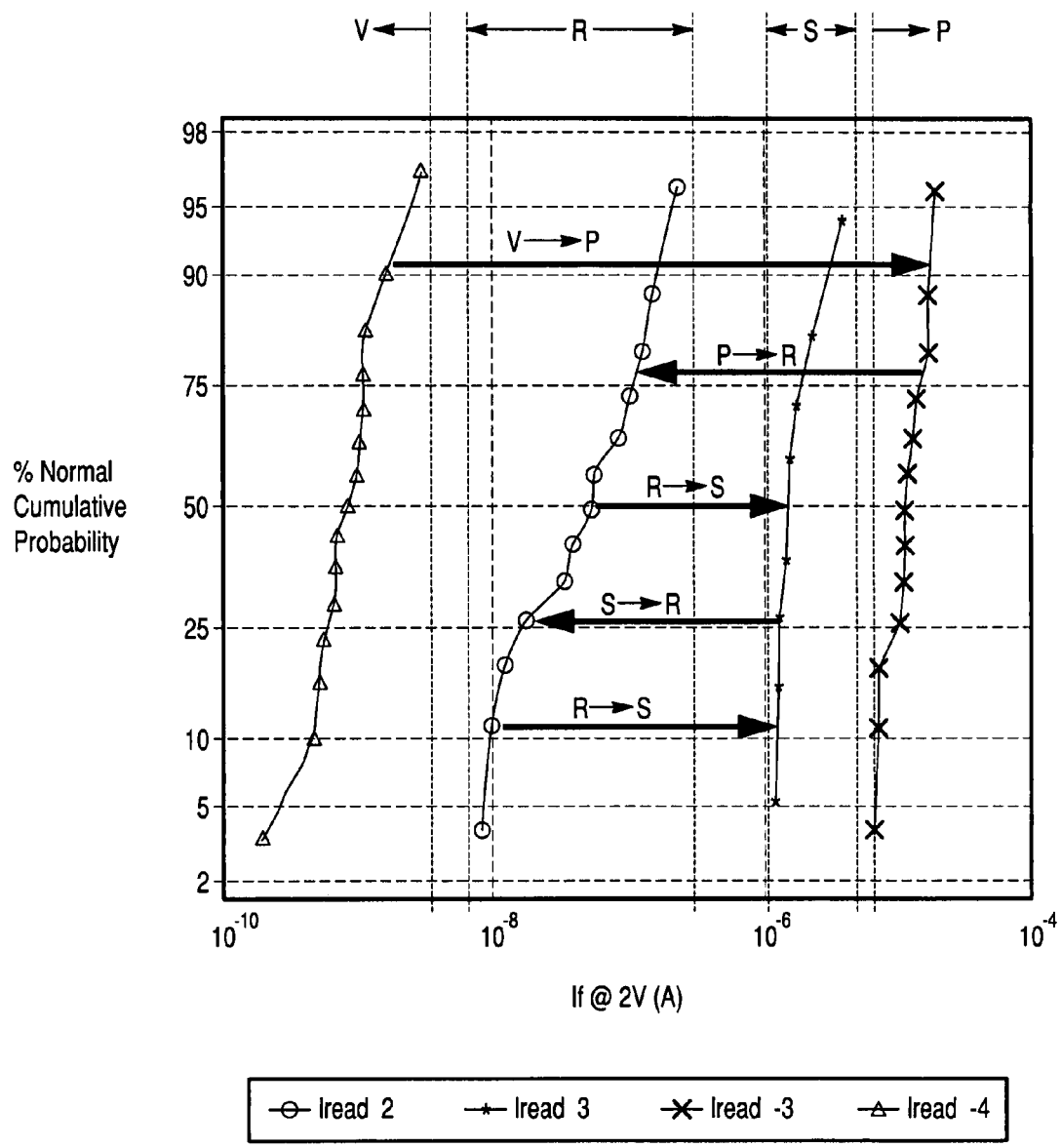
FIG. 11 is a probability plot showing memory cells transformed from the V state to the P state, from the P state to the R state, and from the R state to the S state, then repeatably between the S state and the R state.

Turning to FIG. 11, in a one embodiment, the memory cell is formed in a high resistivity state V, with current at 2 volts about 5 nanoamps or less. FIG. 11 shows percent (%) Normal Cumulative Probability versus read current at 2 volts (If @ 2V (A)) for read current values Iread 2, 3, −3 and −4 corresponding to states R, S, P and V. The plot shown in FIG. 11 is for a cell with a silicon oxide antifuse. For most rewriteable embodiments the initial V state does not serve as a data state of the memory cell. A first electrical pulse, preferably with diode 2 under forward bias, is applied between top conductor 16 and bottom conductor 12. This pulse is, for example, between about 8 and about 12 volts, preferably about 10 volts. This first electrical pulse switches the semiconductor material of diode 2 from a first resistivity state to a second resistivity state P, the second state lower resistivity than the first (labeled V→P). In preferred embodiments, the P state also will not serve as a data state of the memory cell. In other embodiments, the P state will serve as a data state of the memory cell.

A second electrical pulse, preferably with diode 2 under reverse bias, is applied between top conductor 16 and bottom conductor 12. This pulse is, for example, between about −8 and about −4 volts, preferably between about −9 and about −13 volts, more preferably about −10 or −11 volts. The voltage required will vary with the thickness of the intrinsic region. This second electrical pulse switches the semiconductor material of diode 2 from the second resistivity state to a third resistivity state R, the third state higher resistivity than the second (labeled P→R). In preferred embodiments the R state corresponds to a data state of the memory cell.

A third electrical pulse can be applied between top conductor 16 and bottom conductor 12, preferably under forward bias. This pulse is, for example, between about 5.5 and about 9 volts, preferably about 6.5 volts, with current between about 10 and about 200 microamps, preferably between about 50 and about 100 microamps. This third electrical pulse switches the semiconductor material of diode 2 from the third resistivity state R to a fourth resistivity state S, the fourth state lower resistivity than the third (labeled R→S). In preferred embodiments the S state corresponds to a data state of the memory cell.

In this rewriteable, two-state embodiment, the R state and the S state are sensed, or read, as data states. The memory cell can repeatedly be switched between these two states. For example, a fourth electrical pulse, preferably with diode 2 under reverse bias, switches the semiconductor material of the diode from the fourth resistivity state S to the fifth resistivity state R, which is substantially the same as the third resistivity state R (labeled S→R). A fifth electrical pulse, preferably with diode 2 under forward bias, switches the semiconductor material of the diode from the fifth resistivity state R to the sixth resistivity state S, which is substantially the same as the fourth resistivity state S (labeled R→S), and so on. It may be more difficult to return the memory cell to the initial V state and the second P state; thus these states may not be used as data states in a rewriteable memory cell. It may be preferred for both the first electrical pulse, which switches the cell from the initial V state to the P state, and the second electrical pulse, which switches the cell from the P state to the R state, to be performed before the memory array reaches the end user, for example in a factory or test facility, or by a distributor before sale. In other embodiments, it may be preferred for only the first electric pulse, which switches the cell from the initial V state to the P state, to be performed before the memory array reaches the end user.

As will be seen from FIG. 11, in the example provided, the difference between current flow under read voltage, for example of 2 volts, between top conductor 16 and bottom conductor 12 between any cell in one data state and any cell in an adjacent data states, in this case the R data state (between about 10 and about 500 nanoamps) and the S data state (between about 1.5 and about 4.5 microamps), is at least a factor of three. Depending on the ranges selected for each data state, the difference may be a factor of two, three, five, or more.

In alternative embodiments, a rewriteable memory cell can be switched between three or more data states, in any order. Either set or reset transitions can be performed with the diode under either forward or reverse bias.

In both the one-time programmable and rewriteable embodiments described, note that the data state corresponds to the resistivity state of polycrystalline or microcrystalline semiconductor material making up a diode. The data states does not correspond to the resistivity state of a resistivity-switching metal oxide or nitride, as in Herner et al., U.S. patent application Ser. No. 11/395,995, "Nonvolatile Memory Cell Comprising a Diode and a Resistance-Switching Material," filed Mar. 31, 2006, owned by the assignee of the present invention and hereby incorporated by reference.

Reverse Bias Set and Reset

In an array of memory cells formed and programmed according to the embodiments described so far, any step in which cells are subjected to large voltages in reverse bias has reduced leakage current as compared to a forward bias step.

Figure 12:
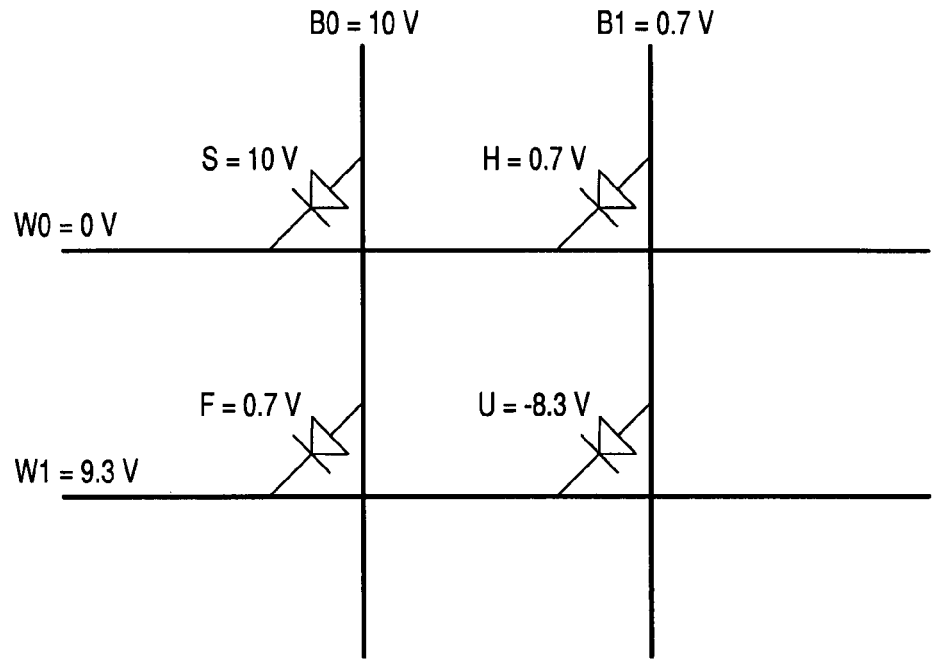
FIG. 12 is a circuit diagram showing a biasing scheme to bias the S cell in forward bias.

Turning to FIG. 12, suppose 10 volts is to be applied in forward bias across the selected cell S. (The actual voltage to be used will depend on many factors, including the construction of the cell, dopant levels, height of the intrinsic region, etc.; 10 volts is merely an example.) Bitline B0 is set at 10 volts and wordline W0 is set at ground. To assure that half-selected cells F (which share bitline B0 with selected cell S) remain below the turn-on voltage of the diode, wordline W1 is set less than but relatively close to the voltage of bitline B0; for example wordline W1 may be set to 9.3 volts, so that 0.7 volts is applied across the F cells (only one F cell is shown, but there may be hundreds, thousands or more.) Similarly, to assure that half-selected cells H (which share wordline W0 with selected cell S) remain below the turn-on voltage of the diode, bitline B1 is set higher than but relatively close to the voltage of wordline W0; for example bitline B1 may be set to 0.7 volts, so that 0.7 volts is applied across cell H (again, there may be thousands of H cells.) The unselected cells U, which share neither wordline W0 or bitline B0 with selected cell S, are subjected to −8.3 volts. As there may be millions of unselected cells U, this results in significant leakage current within the array.

Figure 13:
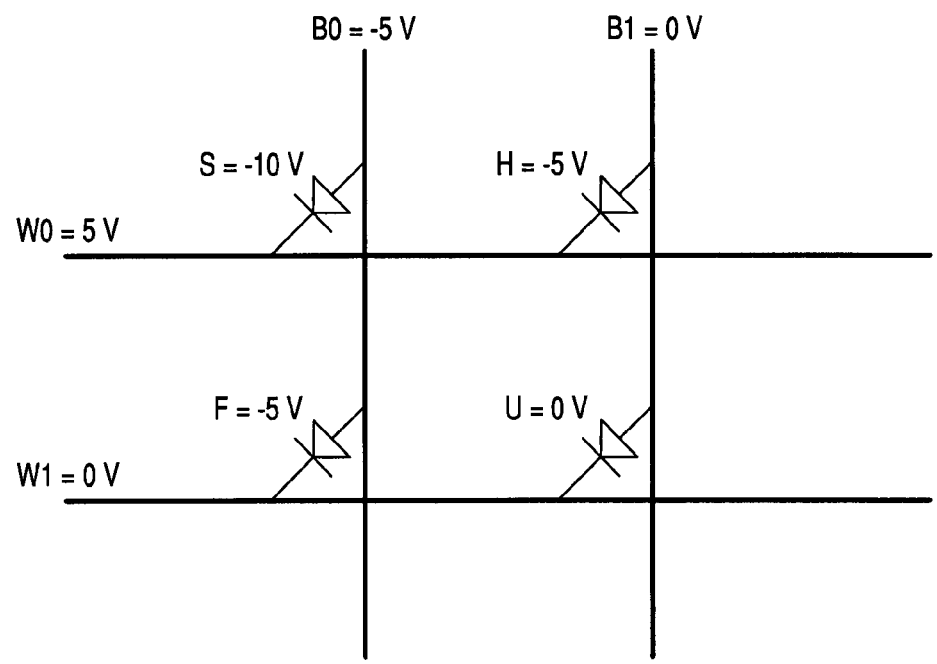
FIG. 13 is a circuit diagram showing one biasing scheme to bias the S cell in reverse bias.

FIG. 13 shows an advantageous biasing scheme to apply a large reverse bias across a memory cell, for example as a reset pulse. Bitline B0 is set at −5 volts and wordline W0 at 5 volts, so that −10 volts is applied across selected cell S; the diode is in reverse bias. Setting wordline W1 and bitline B1 at ground subjects both half-selected cells F and H to −5 volts, at a reverse bias low enough not to cause unintentional set or reset of these cells. Set or reset in reverse bias generally seems to take place at or near the voltage at which the diode goes into reverse breakdown, which is generally higher than −5 volts. With this scheme, there is no voltage across the unselected cells U, resulting in no reverse leakage.

The biasing scheme of FIG. 13 is just one example; clearly many other schemes can be used. For example bitline B0 can be set at 0 volts, wordline W0 at −10 volts, and bitline B1 and wordline W1 at −5 volts. The voltage across selected cell S, half-selected cells H and F, and unselected cells U will be the same as in the scheme of FIG. 13. In another example, bitline B0 is set at ground, wordline W0 at 10 volts, and bitline B1 and wordline W1 each at 5 volts.

Iterative Set and Reset

So far this discussion has described applying an appropriate electrical pulse to switch the semiconductor material of a diode from one resistivity state to a different resistivity state, thus switching the memory cell between two distinct data states. In practice, these set and reset steps may be iterative processes.

As described, the difference between current flow during read in adjacent data states is preferably at least a factor of two; in many embodiments, it may be preferred to establish current ranges for each data state which are separated by a factor of three, five, ten, or more.

Figure 14:
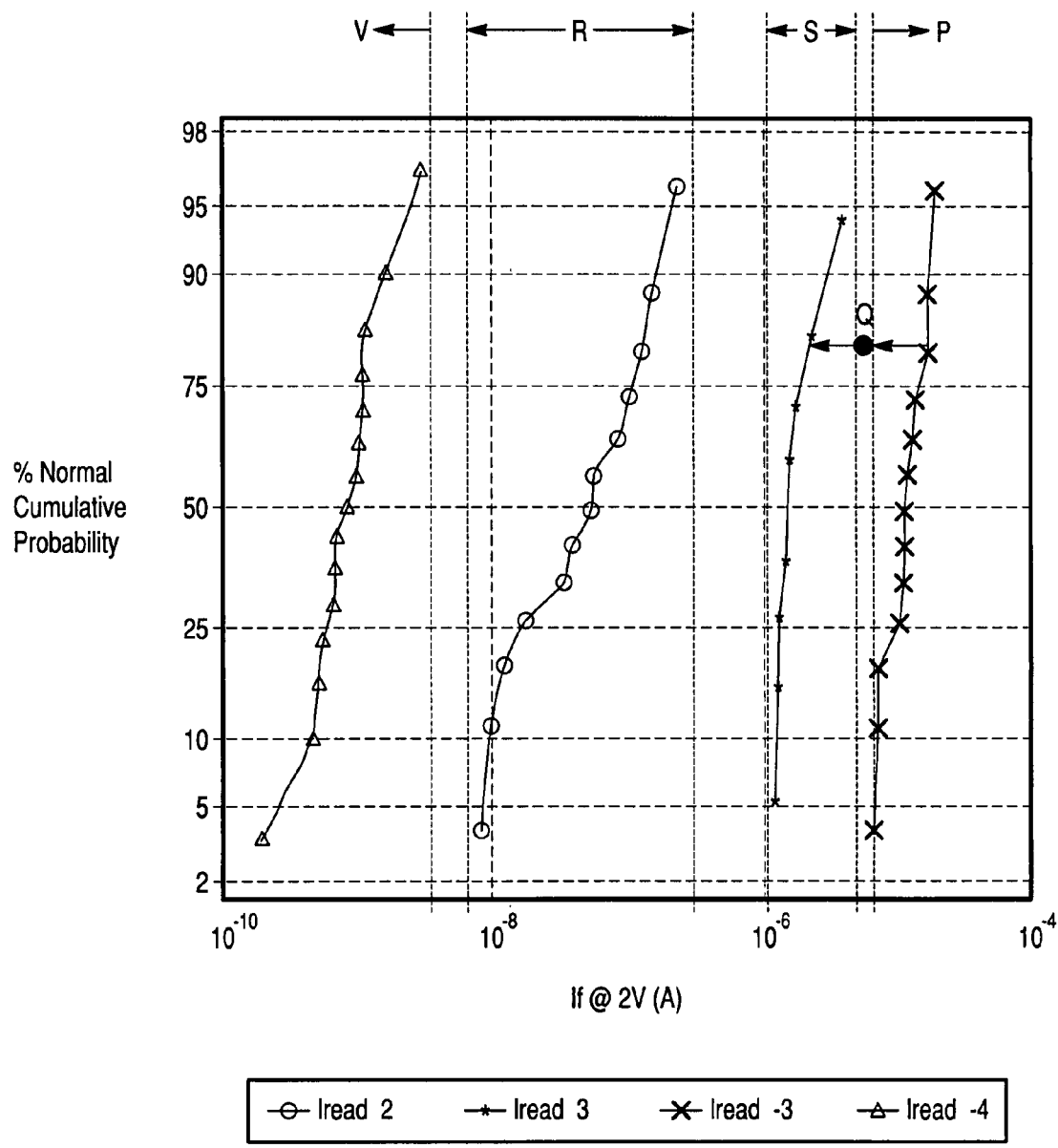
FIG. 14 illustrates iterative read-verify-write cycles to move a cell into a data state.

Turning to FIG. 14, as described, data state V may be defined as read current of 5 nanoamps or less at a read voltage of 2 volts, data state R as read current between about 10 and about 500 nanoamps, data state S as read current between about 1.5 and about 4.5 microamps, and data state P as read current above about 10 microamps. Those skilled in the art will appreciate that these are examples only. In another embodiment, for example, data state V may be defined in a smaller range, with read current about 5 nanoamps or less at a read voltage of 2 volts. Actual read currents will vary with characteristics of the cell, construction of the array, read voltage selected, and many other factors.

Suppose a one-time programmable memory cell is in data state P. An electrical pulse in reverse bias is applied to the memory cell to switch the cell into data state S. In some instances, however, it may be that after application of the electrical pulse, the read current is not in the desired range; i.e. the resistivity state of the semiconductor material of the diode is higher or lower than intended. For example, suppose after application of the electrical pulse, the read current of the memory cell is at the point on the graph shown at Q, in between the S state and P state current ranges.

After an electrical pulse is applied to switch the memory cell to a desired data state, the memory cell may be read to determine if the desired data state was reached. If the desired data state was not reached, an additional pulse is applied. For example, when the current Q is sensed, an additional reset pulse is applied to increase the resistivity of the semiconductor material, decreasing the read current into the range corresponding to the S data state. As described earlier, this set pulse may be applied in either forward or reverse bias. The additional pulse or pulses may have a higher amplitude (voltage or current) or longer or shorter pulse width than the original pulse. After the additional set pulse, the cell is read again, then set or reset pulses applied as appropriate until the read current is in the desired range.

In a two-terminal device, such as the memory cell including a diode described, it will be particularly advantageous to read in order to verify the set or reset and to adjust if necessary. Applying a large reverse bias across the diode may damage the diode; thus when performing a set or reset with the diode under reverse bias, it is advantageous to minimize the reverse bias voltage.

Fabrication Considerations

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed.

When, in contrast, an amorphous or microcrystalline silicon material is crystallized not in contact with a silicon having a silicide with which it has a good lattice match, for example in contact only with materials such as silicon dioxide and titanium nitride, with which it has a significant lattice mismatch, the resulting polysilicon will have many more defects, and doped polysilicon crystallized this way will be much less conductive as formed.

In aspects of the present invention, the semiconductor material forming a diode is switched between two or more resistivity states, changing the current flowing through the diode at a given read voltage, the different currents (and resistivity states) corresponding to distinct data states. It has been found that diodes formed of high-defect silicon (or other appropriate semiconductor materials such as germanium or silicon-germanium alloys) which has not been crystallized adjacent to a silicide or analogous material providing a crystallization template exhibit the most advantageous switching behavior.

Without wishing to be bound by any particular theory, it is believed that one possible mechanism behind the observed changes in resistivity is that set pulses above the threshold amplitude cause dopant atoms to move out of grain boundaries, where they are inactive, into the body of a crystal where they will increase conductivity and lower the resistance of the semiconductor material. In contrast, reset pulses may cause dopant atoms to move back to the grain boundaries, lowering conductivity and increasing resistance. It may be, however, that other mechanisms, such as an increase and decrease in degree of order of the polycrystalline material, are operating as well or instead.

It has been found that the resistivity state of very low-defect silicon crystallized adjacent to an appropriate silicide cannot be switched as readily as when the semiconductor material has a higher level of defects. It may be that the presence of defects, or of a larger number of grain boundaries, allows for easier switching. In preferred embodiments, then, the polycrystalline or microcrystalline material forming the diode is not crystallized adjacent to a material with which it has a small lattice mismatch. A small lattice mismatch is, for example, a lattice mismatch of about three percent or less.

Evidence has suggested that switching behavior may be centered on changes in the intrinsic region. Switching behavior has been observed in resistors and p-n diodes as well, and is not limited to p-i-n diodes, but it is believed that the use of p-i-n diodes may be particularly advantageous. The embodiments described so far included a p-i-n diode. In other embodiments, however, the diode may be a p-n diode instead, with little or no intrinsic region.

A detailed example will be provided describing fabrication of a preferred embodiment of the present invention. Fabrication details from Herner et al., U.S. patent application Ser. No. 10/320,470, "An Improved Method for Making High Density Nonvolatile Memory," filed Dec. 19, 2002, and since abandoned, hereby incorporated by reference, will be useful in formation of the diode of these embodiments, as will information from the '549 application. Useful information may also be derived from Herner et al., U.S. patent application Ser. No. 11/015,824, "Nonvolatile Memory Cell Comprising a Reduced Height Vertical Diode," filed Dec. 17, 2004, assigned to the assignee of the present invention and hereby incorporated by reference. To avoid obscuring the invention not all of the detail from these applications will be included, but it will be understood that no information from these applications is intended to be excluded.

EXAMPLE

Fabrication of a single memory level will be described in detail. Additional memory levels can be stacked, each monolithically formed above the one below it. In this embodiment, a polycrystalline semiconductor diode will serve as the switchable memory element.

Figure 15A:
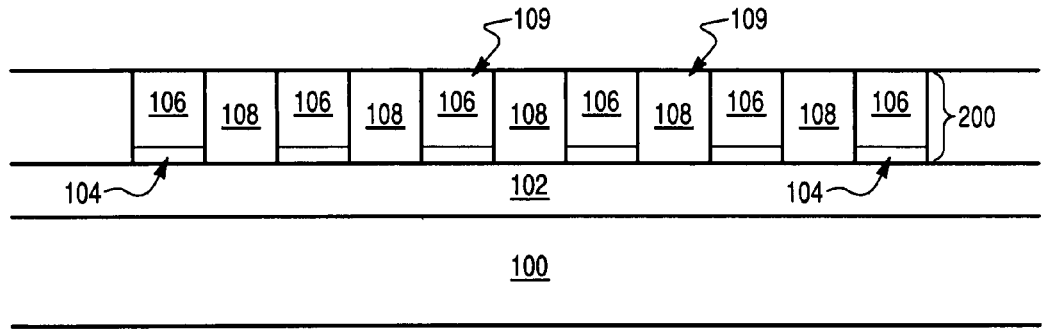
FIGS. 15a-15c are cross-sectional views illustrating stages in formation of a memory level formed according to an embodiment of the present invention.

Turning to FIG. 15a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help conducting layer 106 adhere to insulating layer 102. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 15a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 15a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883,417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 15B:
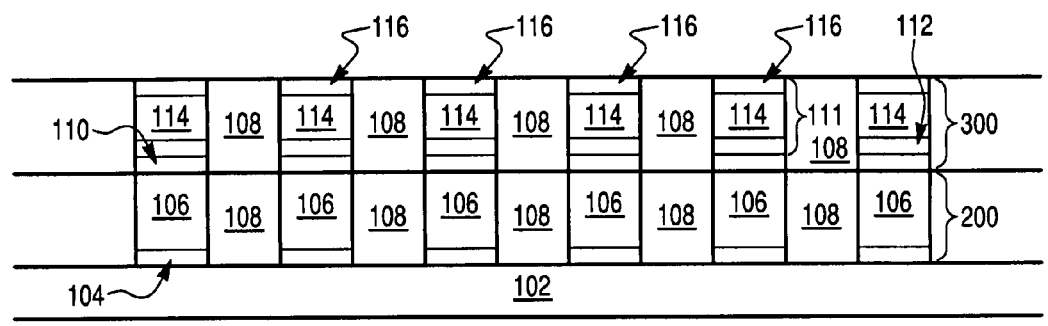

Next, turning to FIG. 15b, vertical pillars will be formed above completed conductor rails 200. (To save space substrate 100 is not shown in FIG. 15b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

In preferred embodiments, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick.

Intrinsic layer 114 can be formed by any method known in the art. Layer 114 can be silicon, germanium, or any alloy of silicon or germanium and has a thickness between about 1100 and about 3300 angstroms, preferably about 2000 angstroms.

Returning to FIG. 15b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top region 116. The p-type dopant is preferably boron or $BCl_3$. This implant step completes formation of diodes 111. The resulting structure is shown in FIG. 15b. In the diodes just formed, bottom heavily doped regions 112 are n-type while top heavily doped regions 116 are p-type; clearly the polarity could be reversed.

Figure 15C:
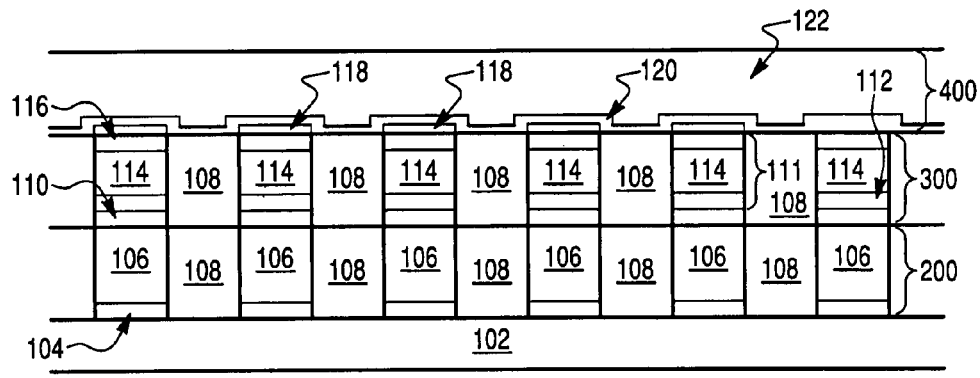

Turning to FIG. 15c, an antifuse dielectric layer 118 is formed on top of each heavily doped region 116. Antifuse 118 is preferably a 10 to 100 Angstrom thick metal oxide layer formed by any suitable deposition method, such as sputtering. If desired, the pillar 300 patterning step may alternatively take place after the deposition of the antifuse dielectric layer 118 deposition step such that layer 118 becomes part of the pillar 300.

Top conductors 400 can be formed in the same manner as bottom conductors 200, for example by depositing adhesion layer 120, preferably of titanium nitride, and conductive layer 122, preferably of tungsten. Conductive layer 122 and adhesion layer 120 are then patterned and etched using any suitable masking and etching technique to form substantially parallel, substantially coplanar conductors 400, shown in FIG. 15c extending left-to-right across the page. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 15*c*, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

In addition to those already described, many alternative embodiments of a memory cell having its data state stored in the resistivity state of polycrystalline or microcrystalline semiconductor material are possible and fall within the scope of the invention. For example, the positions of the p-type region 8 and the n-type region 4 in the diode 2 may be reversed such that the p-type region 8 is located on the bottom of the vertical diode and the n-type region 4 is located at the top of the diode 2.

Detailed methods of fabrication have been described herein, but any other methods that form the same structures can be used while the results fall within the scope of the invention.

Figure 16A:
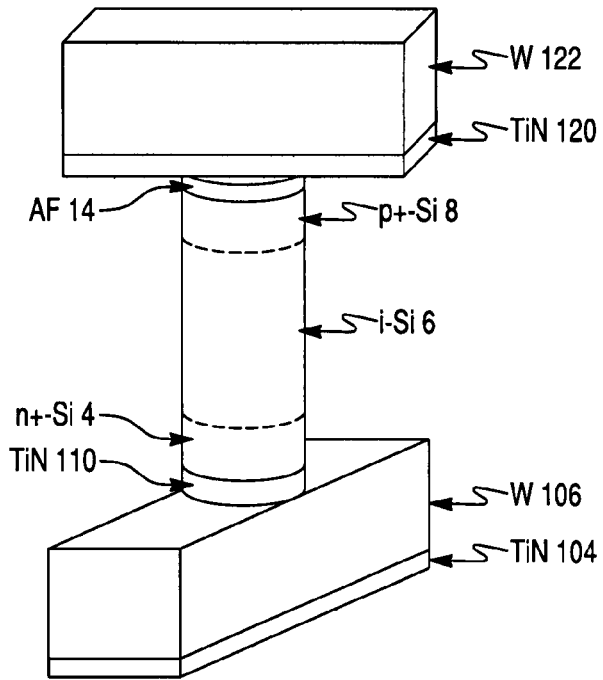
Figure 16B:
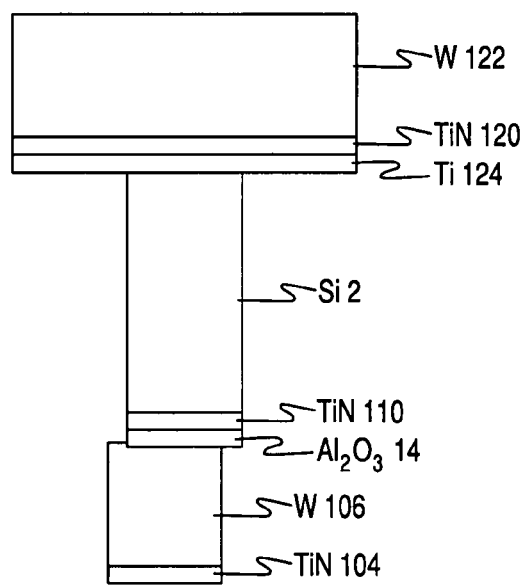

FIGS. 16*a* and 16*b* illustrate two different exemplary memory cells. FIG. 16*a* illustrates a cell where the metal oxide antifuse (AF) dielectric layer 14 is located over the diode which includes a n-type silicon (n+-Si) region 4, an intrinsic (i-Si) region 6, and a p-type silicon (p+-Si) region 8. Specifically, the antifuse dielectric layer 14 is located on the p-type region 8 of the diode. A titanium nitride (TiN) layer 120 and a tungsten (W) layer 122 are located over the metal oxide antifuse (AF) dielectric layer 14. A titanium nitride (TiN) layer 110, a tungsten (W) layer 106, and a titanium nitride (TiN) layer 104 are located under the diode.

In FIG. 16*b*, the antifuse dielectric layer 14 is located below the diode 2. Specifically, the metal oxide (Al$_2$O$_3$) antifuse dielectric layer 14 is separated from the n-type silicon region 4 of the diode by a titanium nitride layer 110. Thus, the Al$_2$O$_3$ antifuse dielectric layer 14 is located between the tungsten (W) layer 106 and the TiN layer 110 in a MIM (metal-insulator-metal) structure underneath the diode in the cell shown in FIG. 16*b*. A titanium (Ti) layer 124 is located between the p-type region of the diode 2 and the upper titanium nitride layer 120. A tungsten (W) layer 122 is located over the titanium nitride (TiN) layer 120. A titanium nitride (TiN) layer 104 is located under the tungsten (W) layer 106.

Figure 17A:
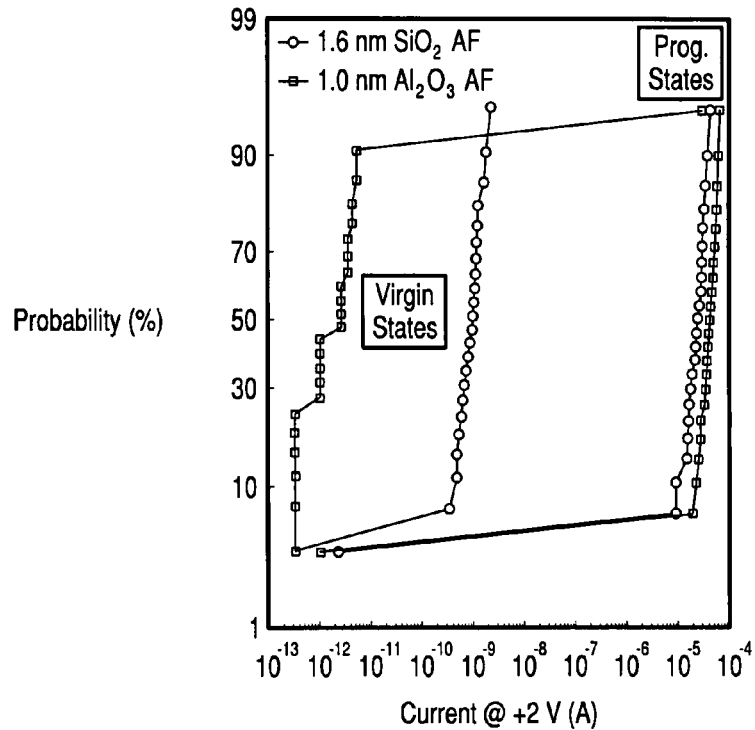
FIGS. 17a-17c are probability plots of various memory cells according to embodiments of the invention and according to comparative examples.

FIG. 17*a* is a probability plot comparing the read current of the memory cell shown in FIG. 16*a* containing a 10 Angstrom thick aluminum oxide antifuse dielectric layer (squares, 1.0 nm Al$_2$O$_3$ AF) with a similar memory cell containing a 16 Angstrom thick silicon dioxide antifuse dielectric layer (circles, 1.6 nm SiO$_2$ AF). FIG. 17*a* shows probability percent (%) versus current at 2 volts (Current @ 2V (A)) for virgin states and programmed states. Both cells were programmed with a +8V pulse. As can be seen in FIG. 17*a*, the read current of the programmed cell with the aluminum oxide antifuse dielectric layer was 30 microamperes at 2V read voltage, while the read current of the programmed cell with the silicon dioxide antifuse dielectric layer was 20 microamperes at 2V read voltage. Thus, the use of the aluminum oxide instead of silicon oxide antifuse dielectric layer provides a 50% improvement in the read current.

Figure 17B:
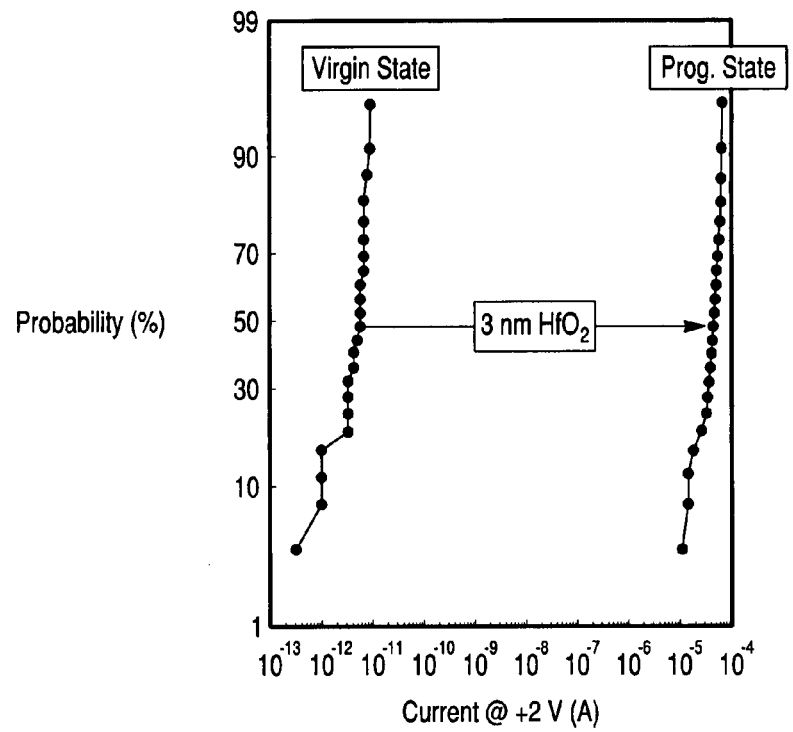

FIG. 17*b* is a probability plot showing the read current of the memory cell shown in FIG. 16*a* containing a 30 Angstrom thick hafnium oxide (3 nm Hf0$_2$) antifuse dielectric layer. FIG. 17*b* shows probability percent (%) versus current at 2 volts (Current @ 2V (A)) for virgin states and programmed states. The cell was programmed with a +10V pulse. As can be seen in FIG. 17*b*, the read current of the programmed cell was 30 microamperes at 2V read voltage.

Figure 17C:
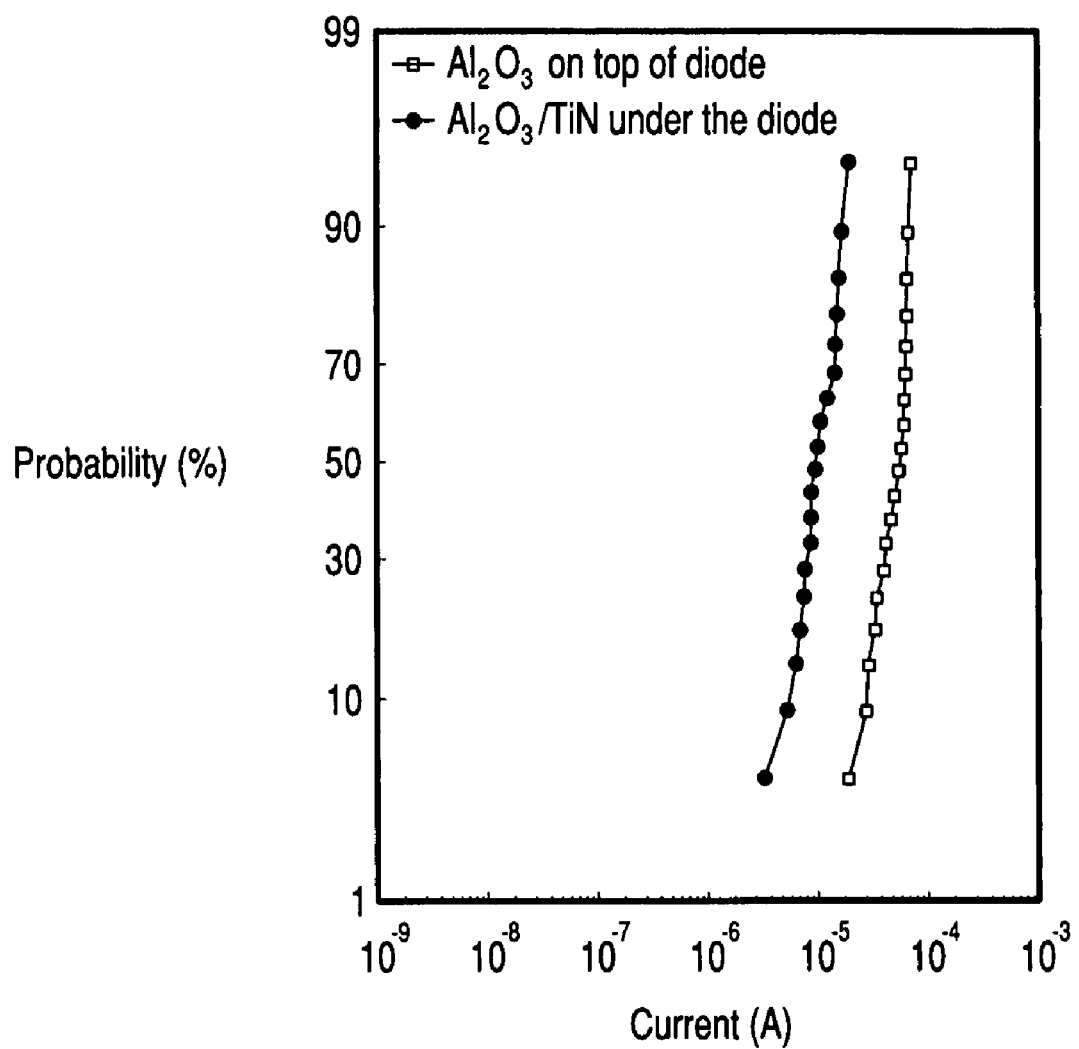

FIG. 17*c* is a probability plot comparing the read current of the programmed memory cell shown in FIG. 16*a* to that of the programmed memory cell shown in FIG. 16*b*. FIG. 17*c* shows probability percent (%) versus current at 2 volts (Current (A)) for Al$_2$O$_3$ on top of the diode and Al$_2$O$_3$/TiN under the diode. While both cells have a similar thickness Al$_2$O$_3$ antifuse, the architecture of FIG. 16*a* with the Al$_2$O$_3$ on top of the diode in contact with the p+-doped silicon region 8 shows a much high forward current than the architecture of FIG. 16*b*. The antifuse dielectric in the MIM configuration shown in FIG. 16*b* resulted in a decreased read current, as shown in FIG. 17*c*, and is not preferred for applications where a high read current is desired.

Without wishing to be bound by a particular theory, the present inventor believes that it is possible that the Al in Al$_2$O$_3$ layer diffuses and mixes into the p-type silicon region 8 of the diode during programming, resulting in a higher forward current. Thus, the p-type region of the diode contains aluminum diffused from the antifuse dielectric layer after the cell is programmed and the conductive link is formed through the dielectric layer. Since Al is a p-type dopant in silicon, this p-type dopant would increase the forward current of the diode due to the better ohmic contact of the p-type region 8 with an adjacent electrode due to the higher concentration of the p-type dopant in the region 8. This indicates that Al$_2$O$_3$ can be placed in contact with the p-type region of the diode in the memory cell. Thus, if the p-type region 8 is located at the bottom of the diode, then the Al$_2$O$_3$ layer 14 can be located under the diode. If the p-type region 8 is located at the top of the diode, then the Al$_2$O$_3$ layer can be located over the diode. In contrast, Si diffused into the diode from SiO$_2$ antifuse dielectric layer can actually degrade the diode as it dilutes the p-type dopant in the p-type region 8 of the diode. Thus, this is a possible explanation of why the aluminum oxide antifuse provides a higher read current than the silicon dioxide antifuse, as shown in FIG. 17*a*.

Hafnium is also a p-type dopant in silicon and can act in the same manner as aluminum, possibly accounting for the result shown in FIG. 17*b*. However, metals other than aluminum from the metal oxide antifuse dielectric generally have much lower solubilities in silicon than aluminum. Thus, they should produce a lower p-type carrier concentration in silicon than aluminum if they diffused into the silicon from the antifuse dielectric layer. For example, while Al has a solubility of greater than $1\times10^{20}$ cm$^{-3}$ at 700 C in Si, Hf is estimated to have a solubility of less than 1 ppm (less than $1\times10^{17}$ cm$^{-3}$) at elevated temperatures in Si.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A nonvolatile memory device, comprising:
   at least one memory cell which comprises a diode and a metal oxide antifuse dielectric layer, the diode including a doped polycrystalline material that comprises a plurality of grains and a plurality of grain boundaries; and
   a first electrode and a second electrode electrically contacting the at least one memory cell;
   wherein in use, the diode acts as a read/write element of the memory cell by switching from a first stable resistivity state to a second stable resistivity state different from the first resistivity state in response to an applied bias such that at least some dopant atoms move from at least some of the plurality of grain boundaries to at least some of the plurality of grains;
   wherein the resistivity state of the diode corresponds to a memory state of the memory cell.

2. The device of claim 1, wherein the diode and the metal oxide antifuse dielectric layer are arranged in series between the first and the second electrodes.

3. The device of claim 2, wherein the metal oxide antifuse dielectric layer has a dielectric constant higher than 3.9.

4. The device of claim 2, wherein the metal oxide antifuse dielectric layer comprises at least one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, or zirconium silicon aluminum oxynitride or combinations thereof with at least one of $SiO_2$ or $SiN_X$.

5. The device of claim 4, wherein the metal oxide antifuse dielectric layer comprises hafnium oxide or aluminum oxide.

6. The device of claim 5, wherein the metal oxide antifuse dielectric layer is located adjacent to a p-type region of the diode.

7. The device of claim 6, wherein:
   the diode comprises a polycrystalline silicon, germanium or silicon-germanium p-i-n pillar diode having a substantially cylindrical shape, and
   the p-type region of the diode contains aluminum or hafnium diffused from the antifuse dielectric layer after the cell is programmed.

8. The device of claim 1, wherein:
   the memory cell comprises a read/write memory cell; and
   the diode comprises a p-i-n semiconductor diode which acts as a read/write element of the memory cell.

9. The device of claim 8, wherein the memory cell comprises a rewritable memory cell.

10. The device of claim 9, wherein:
    an application of a forward bias between the first and the second electrodes is adapted to form a conductive link breaching the metal oxide antifuse dielectric layer and to program the diode;
    the programmed diode is adapted to be placed in a high resistivity, unprogrammed state by an application of a reverse bias to the diode; and
    the diode in the high resistivity, unprogrammed state is adapted to be returned to a low resistivity, programmed state by an application of a forward bias to the diode.

11. The device of claim 1, wherein the device comprises a monolithic, three dimensional array of memory cells.

12. The device of claim 1, wherein the doped polycrystalline material has a degree of order, and the degree of order increases during switching the diode from the first stable resistivity state to the second stable resistivity state.

13. A nonvolatile memory device, comprising:
    a plurality of memory cells, each of the plurality of memory cells being electrically connected to a respective first electrode and a respective second electrode;
    wherein each memory cell of the plurality of memory cells comprises a diode and a metal oxide antifuse dielectric layer arranged in series between the respective first electrode and the respective second electrode, and the diode comprises a polycrystalline silicon, germanium or silicon-germanium p-i-n pillar diode having a substantially cylindrical shape which acts as a read/write element of each of the plurality of the memory cells, the polycrystalline silicon, germanium or silicon-germanium p-i-n pillar diode including a doped polycrystalline material having a degree of order;
    wherein in use, the diode of each of the plurality of the memory cells acts as a read/write element of each of the plurality of the memory cells by switching from a first stable resistivity state to a second stable resistivity state different from the first stable resistivity state in response to an applied bias such that the degree of order increases, and wherein the resistivity state of the diode corresponds to a memory state of the memory cell.

14. The device of claim 13, wherein the metal oxide antifuse dielectric layer comprises at least one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, or zirconium silicon aluminum oxynitride or combinations thereof with at least one of SiO2 or SiNx.

15. The device of claim 14, wherein the metal oxide antifuse dielectric layer comprises hafnium oxide or aluminum oxide.

16. The device of claim 15, wherein the p-type region of the diode contains aluminum or hafnium diffused from the antifuse dielectric layer after the cell is programmed.

17. The device of claim 15, wherein each memory cell provides a read current of at least $3.5\times10^{-5}$ A for at least 1.5V read voltage.

18. The device of claim 13, wherein the metal oxide antifuse dielectric layer has a thickness of 10 to 100 Angstroms.

19. The device of claim 13, wherein:
    the plurality of the memory cells comprise rewritable memory cells;
    an application of a forward bias between the respective first electrode and the respective second electrode is adapted to form a conductive link breaching the metal oxide antifuse dielectric layer and to program the diode in each of the plurality of the memory cells;

the programmed diode is adapted to be placed in a high resistivity, unprogrammed state by an application of a reverse bias to the diode; and the diode in the high resistivity, unprogrammed state is adapted to be returned to the low resistivity, programmed state by an application of a forward bias to the diode.

20. The device of claim 13, wherein the doped polycrystalline material includes a plurality of grains and a plurality of grain boundaries, and at least some dopant atoms move from at least some of the plurality of grain boundaries to at least some of the plurality of grains during switching the diode from the first stable resistivity state to the second stable resistivity state.

* * * * *